(12) United States Patent
Bolz

(10) Patent No.: US 6,307,494 B2
(45) Date of Patent: Oct. 23, 2001

(54) DEVICE AND METHOD FOR THE RAPID DIGITAL/ANALOG CONVERSION OF PULSE WIDTH MODULATED SIGNALS

(75) Inventor: Stephan Bolz, Pfatter (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/748,810

(22) Filed: Dec. 26, 2000

Related U.S. Application Data

(63) Continuation of application No. PCT/DE99/01678, filed on Jun. 8, 1999.

(30) Foreign Application Priority Data

Jun. 25, 1998 (DE) .............................................. 198 28 399

(51) Int. Cl.$^7$ ...................................................... H03M 1/82
(52) U.S. Cl. ........................................... 341/152; 341/143
(58) Field of Search ............................... 327/31; 329/312; 375/238; 341/143, 152; 324/142; 84/608; 318/599, 369; 360/32; 348/473

(56) References Cited

U.S. PATENT DOCUMENTS

| | | | |
|---|---|---|---|
| 3,624,529 | 11/1971 | Gebelein | 329/312 |
| 3,631,399 | * 12/1971 | Minns | 375/238 |
| 4,054,903 | * 10/1977 | Ninomiya | 348/498 |
| 4,238,984 | * 12/1980 | Watanabe | 84/608 |
| 4,616,271 | * 10/1986 | Yasukawa et al. | 360/32 |
| 4,754,219 | * 6/1988 | Milkovic | 324/142 |
| 5,053,688 | * 10/1991 | Rees | 318/599 |
| 5,311,107 | * 5/1994 | Shimegi et al. | 318/369 |
| 5,327,238 | * 7/1994 | Chou | 348/473 |

FOREIGN PATENT DOCUMENTS

| | | |
|---|---|---|
| 3237386C2 | 6/1992 | (DE) . |
| 0417578A2 | 3/1991 | (EP) . |

OTHER PUBLICATIONS

Japanese Patent Abstract No. 03254214 (Yukio), dated Nov. 13, 1991.
Japanese Patent Abstract No. 57048826 (Okimichi), dated Mar. 20,1982.

* cited by examiner

*Primary Examiner*—Peguy Jeanpierre
*Assistant Examiner*—Jean Bruner Jeanglaude
(74) *Attorney, Agent, or Firm*—Herbert L. Lerner; Laurence A. Greenberg; Werner H. Stemer

(57) ABSTRACT

A device for rapid digital/analog conversion of pulse width modulated signals, includes a first changeover switch and an inverting integrator having a resistor, a first capacitor, a second changeover switch, a first operational amplifier, and an integrator output. A non-inverting input of the operational amplifier is connected to a reference voltage. An inverting input is selectively connected to an input through first switch connections and the resistor and to an amplifier output through first switch connections. The first capacitor is disposed between the inverting input and the amplifier output. The second changeover switch selectively connects the integrator output to a second capacitor and the integrator output to a third capacitor. A third changeover switch selectively connects a non-inverting input of a buffer amplifier to the second and third capacitors. The buffer amplifier output is the device output. A monostable multivibrator selectively switches the first changeover switch and is triggered by an input signal. A frequency divider triggers the second and third changeover switches and is triggered by the input signal.

17 Claims, 2 Drawing Sheets

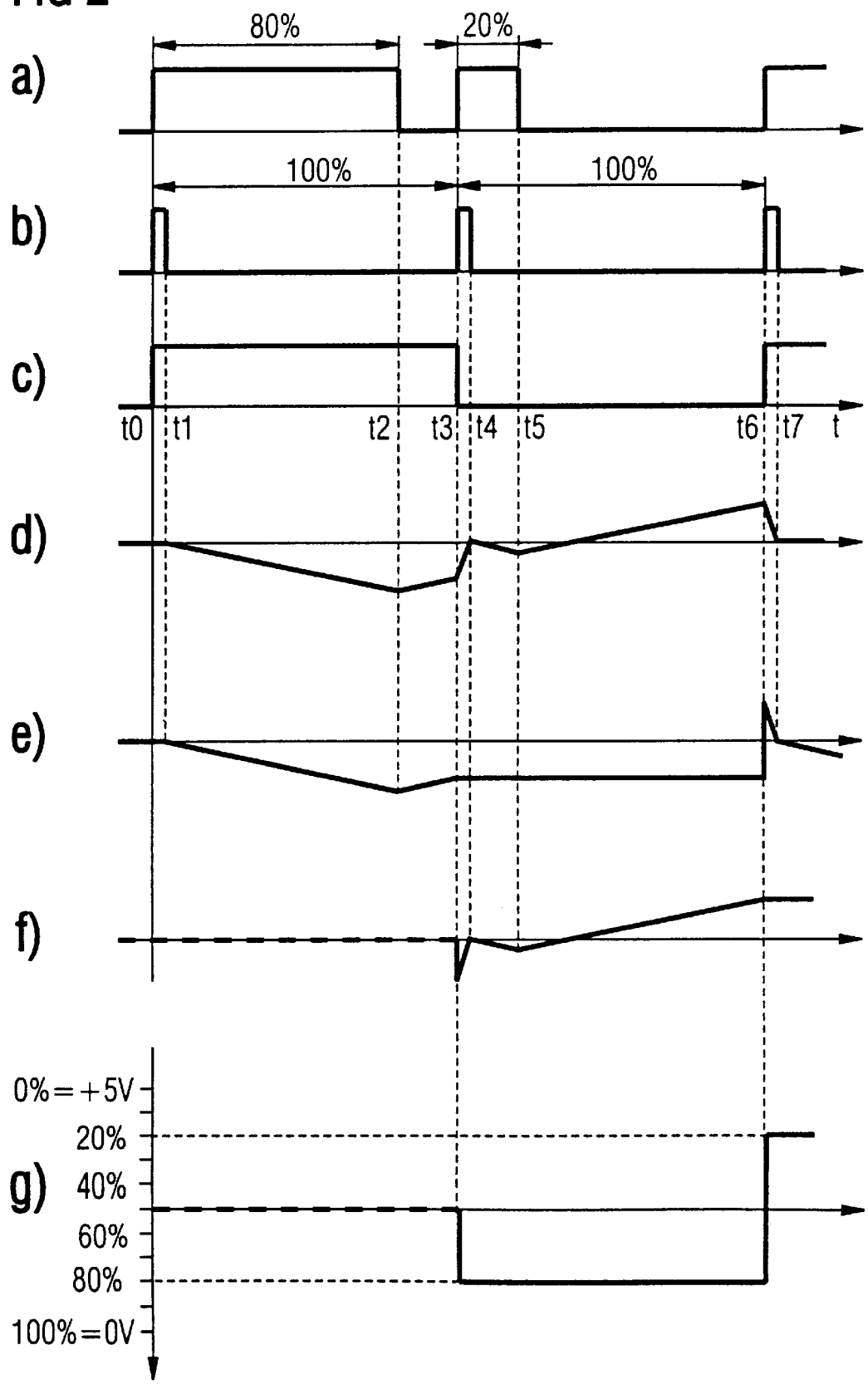

DEVICE AND METHOD FOR THE RAPID DIGITAL/ANALOG CONVERSION OF PULSE WIDTH MODULATED SIGNALS

CROSS-REFERENCE TO RELATED APPLICATION

This application is a continuation of copending International Application No. PCT/DE99/01678, filed Jun. 8, 1999, which designated the United States.

BACKGROUND OF THE INVENTION

FIELD OF THE INVENTION

The invention relates to a device and method for the rapid digital/analog ("D/A") conversion of pulse width modulated ("PWM") signals, particularly of digitized analog output signals from a lambda probe in a motor vehicle that have been converted into PWM signals.

For cost reasons, modern microcontrollers are increasingly being used for digital signal processor applications in control systems. For such use, the analog measured variable is digitized using an analog/digital (A/D) converter, is modified by a program in the microcontroller (filtering, comparison with nominal variables, PID controller, etc.), and is converted subsequently into an analog signal again using a D/A converter. Although microcontrollers usually contain A/D converters for digitizing analog measured variables, a D/A converter is generally not integrated.

One D/A conversion option is to use an external D/A converter; this is the technically optimum solution, but also the most cost intensive. In a serial D/A converter having a clock frequency of, for example, 500 kHz with an accuracy of 10 bits, the conversion time arising is 2 ms in theory, but approximately 3 ms in practice. The conversion time is incorporated in the phase shift of the control loop as a delay time.

A further option is to convert the digital signal in the microprocessor into a signal having a fixed frequency and having a pulse duty factor that is proportional to the digital value, with subsequent external low pass filtering to remove the AC voltage components. This solution is much less expensive than a D/A converter and is, on many occasions, used for less demanding applications. For use in a control system, however, this solution has the disadvantage that the low pass filter required for filtering greatly delays the phase of the signal (group delay time). If the delay is within the control loop, then the delay contributes to the total phase delay for the control loop.

For example, in a third order low pass filter, the attenuation at a frequency of 100 Hz is −60 dB. In other words, the amplitude of a PWM signal at 5V is attenuated to 5 mV. Then, the group delay time is approximately 50 ms. If the PWM frequency is raised to 250 Hz and the low pass filter is matched accordingly, the group delay time would be reduced to 20 ms, which is roughly equivalent to the technical limit of the system.

Patent Abstracts of Japan Vol. 016, No. 055 (E-1165), Feb. 12, 1992 (Feb. 12, 1992)-&JP 03 254214 A (Fuji Electric Co Ltd), Nov. 13, 1991 (Nov. 13, 1991) disclose a device for the D/A conversion of PWM signals that has a flip-flop, two integrators, and a decoupling amplifier. One of the integrators integrates the PWM signal during a High phase and supplies the D/A converted voltage at the output at least during the subsequent Low phase. In the Low phase, the other capacitor is discharged in the meantime.

Patent Abstracts of Japan Vol. 006, No. 119 (E-116), Jul. 3, 1982 (Jul. 3, 1982)-&JP 57 048826 A (Japan Electronic Control Syst. Co. Ltd.), Mar. 20, 1982 (Mar. 20, 1982) disclose a device for the D/A conversion of PWM signals having a monostable multivibrator, an integrator, a storage capacitor, and a decoupling amplifier, the PWM signal being integrated during its Low phase.

German Patent No. DE 32 37 386 C2 discloses a digital/analog converter of the counter type for processing a pulse code modulated stereo sound signal, in which the alternately appearing digital data words for the left and right audio channels are serially converted into corresponding analog currents. The corresponding analog currents are converted in parallel in a respective integrator into voltage signals that subsequently pass through a respective low pass filter.

SUMMARY OF THE INVENTION

It is accordingly an object of the invention to provide a device and method for the rapid digital/analog conversion of pulse width modulated signals that overcomes the hereinafore-mentioned disadvantages of the heretofore-known devices and methods of this general type and that provides an inexpensive device and method for the rapid, accurate D/A conversion of PWM signals without using a cost-intensive D/A converter, but with a phase delay that is comparable to that of a D/A converter.

With the foregoing and other objects in view, there is provided, in accordance with the invention, a device for rapid digital/analog conversion of pulse width modulated signals, particularly, for rapid digital/analog conversion of digitized analog output signals from a lambda probe in a motor vehicle that have been converted into PWM signals, including a device input for carrying an input signal, a device output, a first changeover switch having first, second, and third connections, an inverting integrator having a resistor, a first capacitor, a second changeover switch, a first operational amplifier, and an integrator output, the first operational amplifier having an inverting input, a non-inverting input connected to a reference voltage, and an amplifier output, the inverting input selectively connected to the device input through the first and second connections and the resistor, and the inverting input selectively connected to the amplifier output through the second and third connections, the first capacitor disposed between the inverting input and the amplifier output, a second capacitor, a third capacitor, the second changeover switch having fourth, fifth, and sixth connections, the second changeover switch selectively connecting the integrator output to the second capacitor through the fourth and sixth connections and selectively connecting the integrator output to the third capacitor through the fourth and fifth connections, a buffer amplifier having a non-inverting input, an inverting input, and a buffer amplifier output being the device output, a third changeover switch having seventh, eighth, and ninth connections, the third changeover switch selectively connecting the non-inverting input of the buffer amplifier to the second capacitor through the eighth and ninth connections and selectively connecting the non-inverting input of the buffer amplifier to the third capacitor through the seventh and ninth connections, a monostable multivibrator for producing a multivibrator output signal to selectively switch the first changeover switch, the multivibrator connected to the device input for being triggered by the input signal, the multivibrator having a prescribed operating period, and a frequency divider for producing a divider output signal to trigger the second and third changeover switches, the frequency divider connected to the device input for being triggered by the input signal.

The pulse width modulated signal, integrated per period, is alternately supplied to two capacitors, which provide it during the next particular period as an analog signal for the further processing. After analog/digital re-conversion, the signal is subjected to a nominal/actual value comparison with a digital signal proportional to the pulse width modulated signal, and the difference is subsequently used to correct the pulse width modulated pulse duty factor or the pulse width modulated frequency.

In accordance with another feature of the invention, there is provided a microcontroller for converting analog signals into digital pulse width modulated signals at a constant clock frequency.

In accordance with a further feature of the invention, the microcontroller has an output connected to the device input and an input connected to the device output and to the an inverting input of the buffer amplifier.

In accordance with an added feature of the invention, the frequency divider is a flip-flop.

In accordance with an additional feature of the invention, each of the second and third capacitors has a connection to ground.

With the objects of the invention in view, there is also provided a method for rapid digital/analog conversion of pulse width modulated signals, including the steps of providing a conversion device having, a device input for carrying an input signal, a first changeover switch having first, second, and third connections, an inverting integrator having a resistor, a first capacitor, a second changeover switch, a first operational amplifier, and an integrator output, the first operational amplifier having an inverting input, a non-inverting input, and an amplifier output, the second changeover switch having fourth, fifth, and sixth connections, a buffer amplifier having a non-inverting input, an inverting input, and a buffer amplifier output for outputting an output signal, and a third changeover switch having seventh, eighth, and ninth connections. The non-inverting input of the first operational amplifier is connected to a reference voltage. The first capacitor is connected between the inverting input of the first operational amplifier and the amplifier output. A monostable multivibrator is triggered for a prescribed operating period at each rising edge of the input signal to produce a multivibrator output signal for selectively switching the first changeover switch, in a first position of the first changeover switch, to connect the inverting input of the first operational amplifier to the device input through the first and second connections and the resistor, and, in a second position of the first changeover switch, to connect the inverting input of the first operational amplifier to the amplifier output through the second and third connections. During the operating period, the first changeover switch is changed from the first position, in which the input signal is supplied to the integrator, to the second position, in which the first capacitor is shorted. The input signal is integrated with the integrator to form an integrator voltage taking the reference voltage as a reference. The frequency divider is triggered at each rising edge of the input signal. A divider output signal is produced with the frequency divider for simultaneously triggering the second and third changeover switches, to selectively connect the integrator output to a second capacitor through the fourth and sixth connections in a first position of the second changeover switch and to selectively connect the integrator output to a third capacitor through the fourth and fifth connections in a second position of the second changeover switch, and to selectively connect the non-inverting input of the buffer amplifier to the second capacitor through the eighth and ninth connections in a first position of the third changeover switch and to selectively connect the non-inverting input of the buffer amplifier to the third capacitor through the seventh and ninth connections in a second position of the third changeover switch. The second capacitor is charged to the integrator voltage in one clock period while the third capacitor is connected through the second operational amplifier to the buffer amplifier output, and the output signal is tapped off from at the buffer amplifier output in a preceding clock period. The third capacitor is charged to the integrator voltage in a following clock period while the second capacitor is connected through the second operational amplifier to the buffer amplifier output, and the output signal is tapped off from the buffer amplifier output at the one clock period.

In accordance with yet another mode of the invention, each high phase of the input signal is extended by the operating period of the monostable multivibrator.

In accordance with yet further modes of the invention, the output signal is supplied at particular times or intervals to a microcontroller, the output signal is converted with the microcontroller back into a digital value, the digital value as an actual value is compared with a digital value of a nominal value proportional to a pulse duty factor of an associated input signal, and the pulse duty factor or pulse width modulated frequency is corrected with an ascertained difference between the actual value and the nominal value in a following clock period.

In accordance with yet an added mode of the invention, a difference between the actual value and the nominal value is ascertained to correct the pulse duty factor or the pulse width modulated frequency in each clock period.

In accordance with a concomitant mode of the invention, control signals are produced for the first, second, and third changeover switches with a microcontroller.

The device and method according to the invention has a phase delay that is comparable to that of a digital 10 bit D/A converter operated at a clock frequency of 500 kHz, namely approximately 10 ms at a clock frequency of 100 Hz and approximately 4 ms at a clock frequency of 250 Hz. The device and method according to the invention is much more economical than an integrated D/A converter and has a high fundamental accuracy around the center position, which is particularly important when producing symmetrical output voltages.

Other features that are considered as characteristic for the invention are set forth in the appended claims.

Although the invention is illustrated and described herein as embodied in a device and method for the rapid digital/analog conversion of pulse width modulated signals, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a signal profile diagram for the device of FIG. 1.

DESCRIPTION OF THE PREFERRED EMBODIMENTS

Figure 1:
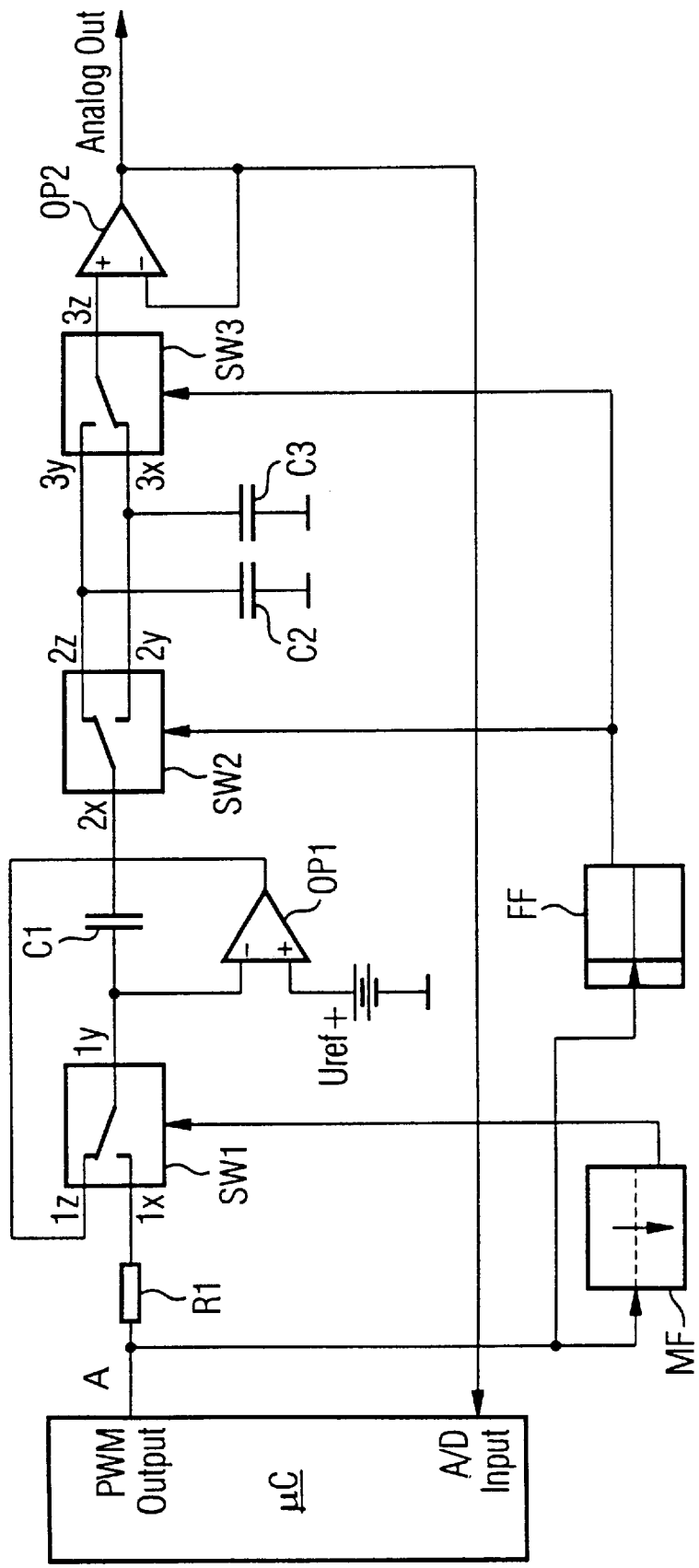
FIG. 1 is a block and schematic circuit diagram of a device according to the invention.

In all the figures of the drawing, sub-features and integral parts that correspond to one another bear the same reference symbol in each case.

Referring now to the figures of the drawings in detail and first, particularly to FIG. 1 thereof, there is shown a microcontroller µC that is supplied with the analog output signal from a sensor, for example, a lambda probe disposed in an exhaust system of an internal combustion engine. In the microcontroller µC, the signal is converted into a digital signal and is processed (filtering, comparison with nominal variables, PID controller, etc.). The processed digital signal appears, having been converted to a PWM signal that is proportional to the digital signal and has a constant frequency, at the output A of the microcontroller µC.

The PWM signal is supplied to a monostable multivibrator MF triggered for a time of between, for example, 30 to 50 µs, and, in parallel with the multivibrator MF, to a flip-flop FF acting as a frequency divider. The monostable multivibrator MF and the flip-flop FF may be eliminated if their output signals are produced in the microcontroller.

The PWM signal is also supplied, through a resistor R1, to a first connection 1x of a first changeover switch SW1 controlled by the output signal from the monostable multivibrator.

A second connection 1y of the first changeover switch SW1 is connected to the inverting input of a first operational amplifier OP1. A first capacitor C1 is connected between the inverting input and the output of the first operational amplifier OP1. The output of the first operational amplifier OP1 is connected to a third connection 1z of the first changeover switch SW1. A reference voltage Uref is applied to the non-inverting input of the first operational amplifier OP1.

The first operational amplifier OP1 forms, together with the first capacitor C1 and the resistor R1, an inverting integrator when the first connection 1x of the first changeover switch SW1 is connected to the second connection 1y. The integrator integrates the PWM signal and converts it into a signal that is symmetrical with respect to a prescribed reference voltage. If the third connection 1z of the first changeover switch SW1 is connected to the second connection 1y, the first capacitor C1 is shorted and is discharged. In such a case, the output voltage of the first operational amplifier OP1 changes to the reference voltage Uref.

The output of the operational amplifier OP1 (of the integrator) is connected to a first connection 2x of a second changeover switch SW2. In addition, a third changeover switch SW3 is provided. The second connection 2y of the second changeover switch SW2 is connected to the first connection 3x of the third changeover switch SW3, and the third connection 2z of the second changeover switch SW2 is connected to the second connection 3y of the third changeover switch SW3.

From the negative pole of an operating voltage, which is 5V, for example, a second capacitor C2 is connected to the connection 2z and a third capacitor C3 is connected to the connection 2y. The third connection 3z of the third changeover switch SW3 is connected to the non-inverting input of a second operational amplifier OP2, which is connected as a buffer amplifier and whose output supplies the PWM signal converted into an analog value. The output is connected to the inverting input of the second operational amplifier OP2.

In one advantageous development of the invention, the output of the second operational amplifier OP2 is connected to the (or to an) A/D converter input of the microcontroller µC. The function of the configuration is described further below.

The second and third changeover switches SW2 and SW3 are changed over synchronously by the output signal from the flip-flop FF, as described in more detail later.

Signal profile a) in FIG. 2 shows two periods of the PWM signal appearing at the output A of the microcontroller µC. A pulse duty factor of 80% is assumed in the first period and a pulse duty factor of 20% is assumed in the second period.

Plotted on the abscissa of all the signal profiles in FIG. 2 is time t; the zero points on the ordinates for signals a), b), and c) are ostensibly associated with a potential of 0V="L", while the amplitudes of these signals are meant to have a potential of +5V="H". The zero points on the ordinates for the signals d) to g) are ostensibly associated with a potential of +2.5V, while the amplitudes of these signals can have a potential of +2.5V±2.5V (that is to say +5V and 0V).

The method for operating the device is explained in more detail below with the aid of the signal profiles a) to g) shown in FIG. 2.

The "turned-on position" of the first changeover switch SW1 (output signal mf from the monostable multivibrator at +5V=H; connections 1x and 1y connected to one another; t0 to t2) is used to supply the PWM signal (FIG. 2a) to the inverting integrator.

At the rising edge of the PWM signal (FIG. 2a), the first capacitor C1 is shorted through the first changeover switch SW1 (connections 1y and 1z connected to one another) for the duration of a prescribed operating period of the edge-triggered monostable multivibrator MF of approximately 30 to 50 µs (t0 to t1) and is then at the reference potential of +2.5V. The discharge time is very short, compared with the PWM period of 10 ms (4 ms). To prevent any error during the A/D conversion, the High phase of each PWM signal may be extended by this 30 to 50 µs.

Starting at instant t1, the first capacitor C1 is discharged through the first changeover switch SW1 (connections 1x and 1y connected to one another) at a charging/discharging rate of 2.5V/period, for as long as the PWM signal is at the H level (t1 to t2 in FIG. 2d). With an assumed clock frequency of 100 Hz and a pulse duty factor of 80%, the capacitor is discharged to a voltage of +2.5V−0.8*2.5V=+0.5V, which it reaches at instant t2.

The PWM signal is then at the L level for the remainder of 20% of the period (t2 to t3); during this time, the first capacitor C1 is charged from +0.5V by 0.2*2.5V=0.5V to +1V.

During the second period (t3 to t6) the process is repeated, starting with the first capacitor C1 being shorted at +2.5V (t3 to t4; FIG. 2(b), 2(d)), subsequent discharging (20% period) to +2.5V−0.2*2.5V=+2V (t4 to t5) and charging (80% period) to 2.0V+0.8*2.5V=+4.0V (t5 to t6).

At each rising edge of the PWM signal (t0, t3, t6 . . . ), the flip-flop FF is changed over. The flip-flop output signal is shown in FIG. 2(c). The output signal FF controls the two changeover switches SW2 and SW3 such that, for example in one period (from to to t3, if FF=H), the second capacitor C2 is connected to the output of the first operational amplifier OP1, and the third capacitor C3 is connected to the non-inverting input of the second operational amplifier OP2, and, in the next period (from t3 to t6, if FF=L), the second capacitor C2 is connected to the non-inverting input of the second operational amplifier OP2, and the third capacitor C3 is connected to the output of the first operational amplifier OP1, etc.

As a result, in the one (first) period (t0 to t3), the second capacitor C2 follows the voltage of the first capacitor C1 exactly. It keeps the voltage that it has at the changeover instant t3 constant for the next period (t3 to t6); the voltage appears at the output of the second operational amplifier OP2 for the total duration of the second period (FIG. 2(e)).

In the next (second) period (t3 to t6), the third capacitor C3 follows the voltage of the first capacitor C1 exactly. It keeps the voltage that it has at the changeover instant t6 constant for the following period (after t6); the voltage appears at the output of the second operational amplifier OP2 for the total duration of the third period (FIGS. 2(f), 2(g)).

The synchronous changeover at the start of each PWM period results in the capacitors C2, C3 being charged slowly at the speed of the integrator. The slow charging prevents high charging currents. The voltage across these capacitors follows the integrator voltage with equivalent precision. For C2 and C3, capacitors having high capacitance values can be used, which reduces the voltage drop in the holding phases. At the end of each integration phase (PWM period), the present voltage value is available immediately. As such, the PWM signal is converted into an analog signal (voltage scale on the ordinate of FIG. 2(g)), with a PWM pulse duty actor of 0% corresponding to a voltage at the output of the second operational amplifier OP2 of +5V; 50%≡+2.5V, 100%≡0 V.

The phase delay (equivalent to the period) in the circuit described is 10 ms for an assumed clock frequency of 100 Hz, 4 ms at 250 Hz. As such, the phase delay is in the order of magnitude of a digital A/D converter (approximately 3 ms) and is much shorter—by a factor of 5—than in the case of a solution using a low pass filter (described in the introduction (50/20 ms)).

The accuracy of the output signal from the integrator depends on the following sources of error:

on the time constant of the integration elements R1, C1;
on the accuracy of the reference voltage Uref; and
on the offset voltages of the operational amplifiers OP1, OP2.

These errors are a long way above those of a 10 bit D/A converter. The already mentioned return of the D/A converted output signal from the operational amplifier OP2 to the A/D converter in the microcontroller μC allows the value of the signal produced to be compared with the original digital value and used for error correction.

The error correction can take place in static form, for example, by producing and integrating PWM signals having a pulse duty factor of 0%, 50% and 100%, the actual pulse duty factor or the frequency being controlled such that the nominal/actual difference is minimized. The PWM values obtained form—by linear interpolation—the basis of calculation for intermediate values.

The method operates without any further time delay, but requires cyclic repetition in order to compensate for temperature drifts.

The error correction can also take place dynamically using a continuous nominal/actual comparison, by using the ascertained error signal directly to correct the following signal value. Such correction requires a software PID controller.

I claim:

1. A device for rapid digital/analog conversion of pulse width modulated signals, comprising:

a device input for carrying an input signal;
a device output;
a first changeover switch having first, second, and third connections;
an inverting integrator having a resistor, a first capacitor, a second changeover switch, a first operational amplifier, and an integrator output;
said first operational amplifier having an inverting input, a non-inverting input connected to a reference voltage, and an amplifier output, said inverting input selectively connected to said device input through said first and second connections and said resistor, and said inverting input selectively connected to said amplifier output through said second and third connections;
said first capacitor disposed between said inverting input and said amplifier output;
a second capacitor;
a third capacitor;
said second changeover switch having fourth, fifth, and sixth connections, said second changeover switch selectively connecting said integrator output to said second capacitor through said fourth and sixth connections and selectively connecting said integrator output to said third capacitor through said fourth and fifth connections;
a buffer amplifier having a non-inverting input, an inverting input, and a buffer amplifier output being said device output;
a third changeover switch having seventh, eighth, and ninth connections, said third changeover switch selectively connecting said non-inverting input of said buffer amplifier to said second capacitor through said eighth and ninth connections and selectively connecting said non-inverting input of said buffer amplifier to said third capacitor through said seventh and ninth connections;
a monostable multivibrator for producing a multivibrator output signal to selectively switch said first changeover switch, said multivibrator connected to said device input for being triggered by the input signal, said multivibrator having a prescribed operating period; and
a frequency divider for producing a divider output signal to trigger said second and third changeover switches, said frequency divider connected to said device input for being triggered by the input signal.

2. The device according to claim 1, including a microcontroller for converting analog signals into digital pulse width modulated signals at a constant clock frequency.

3. The device according to claim 2, wherein said microcontroller has an output connected to said device input and an input connected to said device output and to said an inverting input of said buffer amplifier.

4. The device according to claim 1, wherein said frequency divider is a flip-flop.

5. The device according to claim 1, wherein each of said second and third capacitors has a connection to ground.

6. A device for rapid digital/analog conversion of digitized analog output signals from a lambda probe in a motor vehicle that have been converted into PWM signals, comprising:

a device input for carrying an input signal;
a device output;
a first changeover switch having first, second, and third connections;
an inverting integrator having a resistor, a first capacitor, a second changeover switch, a first operational amplifier, and an integrator output;

said first operational amplifier having an inverting input, a non-inverting input connected to a reference voltage, and an amplifier output, said inverting input selectively connected to said device input through said first and second connections and said resistor, and said inverting input selectively connected to said amplifier output through said second and third connections;

said first capacitor disposed between said inverting input and said amplifier output;

a second capacitor;

a third capacitor;

said second changeover switch having fourth, fifth, and sixth connections, said second changeover switch selectively connecting said integrator output to said second capacitor through said fourth and sixth connections and selectively connecting said integrator output to said third capacitor through said fourth and fifth connections;

a buffer amplifier having a non-inverting input, an inverting input, and a buffer amplifier output being said device output;

a third changeover switch having seventh, eighth, and ninth connections, said third changeover switch selectively connecting said non-inverting input of said buffer amplifier to said second capacitor through said eighth and ninth connections and selectively connecting said non-inverting input of said buffer amplifier to said third capacitor through said seventh and ninth connections;

a monostable multivibrator for producing a multivibrator output signal to selectively switch said first changeover switch, said multivibrator connected to said device input for being triggered by the input signal, said multivibrator having a prescribed operating period; and a frequency divider for producing a divider output signal to trigger said second and third changeover switches, said frequency divider connected to said device input for being triggered by the input signal.

7. A method for rapid digital/analog conversion of pulse width modulated signals, which comprises:
providing a conversion device having:
a device input for carrying an input signal;
a first changeover switch having first, second, and third connections;
an inverting integrator having a resistor, a first capacitor, a second changeover switch, a first operational amplifier, and an integrator output;
the first operational amplifier having an inverting input, a non-inverting input, and an amplifier output;
the second changeover switch having fourth, fifth, and sixth connections;
a buffer amplifier having a non-inverting input, an inverting input, and a buffer amplifier output for outputting an output signal; and
a third changeover switch having seventh, eighth, and ninth connections;
connecting the non-inverting input of the first operational amplifier to a reference voltage;
connecting the first capacitor between the inverting input of the first operational amplifier and the amplifier output;
triggering a monostable multivibrator for a prescribed operating period at each rising edge of the input signal to produce a multivibrator output signal for selectively switching the first changeover switch:
in a first position of the first changeover switch, to connect the inverting input of the first operational amplifier to the device input through the first and second connections and the resistor; and
in a second position of the first changeover switch, to connect the inverting input of the first operational amplifier to the amplifier output through the second and third connections;

during the operating period, changing the first changeover switch from the first position, in which the input signal is supplied to the integrator, to the second position, in which the first capacitor is shorted;

integrating the input signal with the integrator to form an integrator voltage taking the reference voltage as a reference;

triggering the frequency divider at each rising edge of the input signal;

producing a divider output signal with the frequency divider for simultaneously triggering the second and third changeover switches:
to selectively connect the integrator output to a second capacitor through the fourth and sixth connections in a first position of the second changeover switch and to selectively connect the integrator output to a third capacitor through the fourth and fifth connections in a second position of the second changeover switch; and to selectively connect the non-inverting input of the buffer amplifier to the second capacitor through the eighth and ninth connections in a first position of the third changeover switch and to selectively connect the non-inverting input of the buffer amplifier to the third capacitor through the seventh and ninth connections in a second position of the third changeover switch;

charging the second capacitor to the integrator voltage in one clock period while the third capacitor is connected through the second operational amplifier to the buffer amplifier output, and tapping off the output signal from a preceding clock period at the buffer amplifier output; and charging the third capacitor to the integrator voltage in a following clock period while the second capacitor is connected through the second operational amplifier to the buffer amplifier output, and tapping off the output signal from the one clock period at the buffer amplifier output.

8. The method according to claim 7, which further comprises extending each high phase of the input signal by the operating period of the monostable multivibrator.

9. The method according to claim 7, which further comprises:
supplying the output signal at particular times to a microcontroller;
converting the output signal with the microcontroller back into a digital value;
comparing the digital value as an actual value with a digital value of a nominal value proportional to a pulse duty factor of an associated input signal; and
correcting the pulse duty factor with an ascertained difference between the actual value and the nominal value in a following clock period.

10. The method according to claim 9, which further comprises performing the correcting step by correcting a pulse width modulated frequency with an ascertained difference between the actual value and the nominal value in a following clock period.

11. The method according to claim 10, which further comprises ascertaining the difference between the actual value and the nominal value to correct the pulse width modulated frequency in each clock period.

12. The method according to claim 9, which further comprises ascertaining the difference between the actual value and the nominal value to correct the pulse duty factor in each clock period.

13. The method according to claim 7, which further comprises:
   supplying the output signal at prescribed intervals to a microcontroller;
   converting the output signal with the microcontroller back into a digital value;
   comparing the digital value as an actual value with a digital value of a nominal value proportional to a pulse duty factor of an associated input signal; and
   correcting the pulse duty factor with an ascertained difference between the actual value and the nominal value in a following clock period.

14. The method according to claim 13, which further comprises performing the correcting step by correcting a pulse width modulated frequency with an ascertained difference between the actual value and the nominal value in a following clock period.

15. The method according to claim 14, which further comprises ascertaining the difference between the actual value and the nominal value to correct the pulse width modulated frequency in each clock period.

16. The method according to claim 13, which further comprises ascertaining the difference between the actual value and the nominal value to correct the pulse duty factor in each clock period.

17. The device according to claim 7, which further comprises producing control signals for the first, second, and third changeover switches with a microcontroller.

* * * * *